United States Patent [19]
Held

[11] Patent Number: 5,330,595
[45] Date of Patent: Jul. 19, 1994

[54] PROCESS OF MAKING RESIN-IMPREGNATED MATERIAL WEBS

[76] Inventor: Kurt Held, Alte Strasse 1, D-7218 Trossingen 2, Fed. Rep. of Germany

[21] Appl. No.: 940,122

[22] Filed: Sep. 3, 1992

[30] Foreign Application Priority Data

Sep. 3, 1991 [DE] Fed. Rep. of Germany ....... 4129190

[51] Int. Cl.$^5$ ..................... B29C 47/06; B29C 47/34; B29C 47/92; B32B 31/30
[52] U.S. Cl. ................... 156/64; 156/244.27; 156/309.9; 156/322; 156/324; 264/40.2; 264/40.4; 264/171; 264/211.12; 264/DIG. 65
[58] Field of Search ................... 264/40.2, 40.4, 40.7, 264/171, 211.12, 237, DIG. 65; 425/140, 371; 156/64, 244.27, 309.9, 322, 324, 555, 583.5; 100/93 RP, 153, 154; 165/2, 61, 120

[56] References Cited

U.S. PATENT DOCUMENTS 4,396,566  8/1983  Brinkmann et al. ................ 264/70
4,844,766  7/1989  Held ................................. 156/309.9

FOREIGN PATENT DOCUMENTS 24895    3/1981  European Pat. Off. .
1301463  3/1959  Fed. Rep. of Germany .
1903783 11/1969  Fed. Rep. of Germany .
2312816  2/1975  Fed. Rep. of Germany .
3834993  4/1990  Fed. Rep. of Germany .

OTHER PUBLICATIONS

Kunstoff-Handbuch (Handbook of Plastics), vol. XI, pp. 166–167, Carl Hanser Verlag, Munich, 1971.

Primary Examiner—Leo B. Tentoni
Attorney, Agent, or Firm—Anderson Kill Olick & Oshinsky

[57] ABSTRACT

The invention is directed to an apparatus and process for the continuous fabrication of resin impregnated material webs in which low-solvent resin is extruded to form a film which is joined with the material web to form a layer formation, or the resin is spread on the material web. The layer formation is subsequently subjected to an area pressure. The apparatus including an extruder or a spreading device, and a continuously operating double band press exerting an area pressure.

28 Claims, 5 Drawing Sheets

PROCESS OF MAKING RESIN-IMPREGNATED MATERIAL WEBS

FIELD OF THE INVENTION

The present invention concerns generally the manufacture of webs and is more particularly directed to an apparatus and process for the continuous fabrication of resin impregnated material webs.

BACKGROUND OF THE INVENTION

Resin impregnated material webs are needed for the fabrication of laminates or laminated materials, such as decorative laminates, for the surface coating of chip boards, copper-lined laminates as base material for printed circuit boards, and the like. In the fabrication of laminates, the resin impregnated material webs are arranged in layers in the desired sequence and pressed together. Normally, fiber or woven webs are used as material webs, e.g. paper webs, woven glass webs, fiber glass mats, etc. Duroplastic resins such as melamine, urea, phenol, epoxy and thermoplastic resins are used for impregnating the material webs.

Resin impregnated material webs are fabricated by winding off the material web from a roll, guiding the web through an impregnating bath and a subsequent drying channel, and winding the web on a roll which is stored for further processing. The resin which can be provided with a hardener and an accelerator, if required, is in a fluid state in the impregnating bath. The resin is dissolved in a solvent for this purpose. Water, alcohol, ester or hydrocarbons or mixtures thereof are used as solvents. If a duroplastic resin is used, this is pre-cured, to a certain extent, i.e. to the so-called A-state. The material web is saturated with resin solution when passing through the impregnating bath. The excess resin is squeezed out when it leaves the impregnating bath.

The solvent is removed from the material web in the drying channel by supplying heat by infrared radiators or a flow of hot air. The duroplastic resin is simultaneously cured to the so-called B-state. The B-state involves a reaction of the resin resulting in a stable, but still meltable state of the resin. The fabrication of the resin impregnated material web, also called prepreg, is then concluded.

During the subsequent pressing of the resin impregnated material webs which can be carried out, e.g., continuously in a double band press or discontinuously in a platen press, the duroplastic resin is finally completely cured until reaching the C-state and connects the individual layers to form the compact laminate.

A disadvantage in this method is that a solvent is required to achieve the fluid state of the resin in the impregnating bath which enables penetration into the material web. This solvent must then be removed in the drying channel, which leads to considerable environmental loading. The solvent can usually not be removed completely so that inclusions of the solvent remains in the laminate during the subsequent pressing of the material webs to form the laminate, which in turn lowers the quality of the laminate. Further, it has been shown that the application of resin is very often not uniform over the surface area, which ultimately leads to fluctuations in the characteristics of the laminate. The penetration of the resin into the fibers of the material webs is sometimes unsatisfactory, resulting in a poor bond between the individual layers of the laminate. Moreover, very long drying channels are required before the resin has cured to the B-state, which greatly increases the cost of the installations for the fabrication of resin impregnated material webs.

DE-OS 38 34 993 discloses a process in which the material web which has not been impregnated with resin is wound off a roll and placed on the portion of a press band returning to the inlet zone of a double band press from the outlet zone. Prior or subsequent to this, the material web is provided with a low-solvent resin. The returning band portion is heated so that the material web provided with resin is acted upon by heat and the impregnating and drying processes for the material web takes place on the returning band portion. The resin impregnated material web is combined with the rest of the material webs at the inlet to the double band press and then pressed together to form a laminate in the double band press under the influence of heat and pressure.

In this process, the impregnation of the material webs with resin and the pressing of the material webs to form the laminate are integrated in a one-step process. To obtain a laminate which is completely cured to the C-state in pressing, the press bands of the double band press must be operated at a feed rate which is dependent on the state and type of the resin. The impregnation and drying processes carried out on the returning band portion take place at the same speed depending on the system. This speed however is generally not the same as that at which resin impregnated material webs which are optimally cured to the B-state before entering the double band press are obtained. The pre-curing and curing conditions at the returning band portion or in the actual reaction zone of the double band press are in a ratio which is fixed by the given dimensions of the apparatus, but unfavorable for optimal curing conditions because they cannot be varied. There is accordingly a risk that laminated webs will be produced which do not satisfy demands with respect to quality.

In many cases, laminates are composed of more than two resin impregnated material webs. For example, the laminated material core of copper-lined laminates may require between eight and ten woven glass webs impregnated with epoxy resin. The impregnating and drying processes of a plurality of material webs must accordingly be carried out simultaneously on each of the two returning band portions of the two press bands of the double band press. Since the material webs are arranged, one on top of the other, it has been shown that the material webs are not impregnated and pre-cured uniformly and sufficiently. This results in low quality laminates.

Although the one-step process according to DE-OS 38 34 993 makes it possible to use low-solvent resins, this process has not been successful. Part of the reason for this is that increasingly greater quantities of prepreg which must be pressed in sheets are needed for the operation of existing production plants outfitted with platen presses, and particularly for the gluing of multiple-layer printed circuit boards. These quantities will increase even more in the future.

It is therefore an object of the invention to improve the fabrication of resin impregnated material webs so as to ensure a resin impregnation into the fibers of the material webs completely and uniformly over the surface with the use of solvent-free resin.

Another object of the invention is to provide a process and apparatus for the continuous fabrication of resin impregnated material webs.

SUMMARY OF THE INVENTION

These and other objects of the invention, which shall become apparent hereafter, are achieved by a process and apparatus for the continuous fabrication of resin impregnated material webs in which very small quantities of solvent, or none at all, are used and the environmental problems involved in the use of these solvents are eliminated. The resin impregnated material webs have no inclusions of air or solvent and are accordingly completely free of bubbles. The technical characteristics of the laminate are accordingly improved. The process provides resin impregnated material webs in which the area weight of the applied resin lies within a much narrower tolerance range than was previously the case, which likewise leads to an improvement of the qualitative characteristics of the laminate. In addition, the impregnation can be carried out at higher temperatures than those in conventional impregnation installations so that a greater impregnation speed can be achieved. The output of the installation is accordingly increased and the installation can have a shorter and consequently less expensive construction. The invention accordingly also leads to a greater economy in the fabrication of resin impregnated material webs.

BRIEF DESCRIPTION OF THE DRAWINGS

The invention will be better understood by the Detailed Description of the Preferred Embodiment, in connection with the drawings, of which.

DETAILED DESCRIPTION OF THE PREFERRED EMBODIMENT

Figure 1:
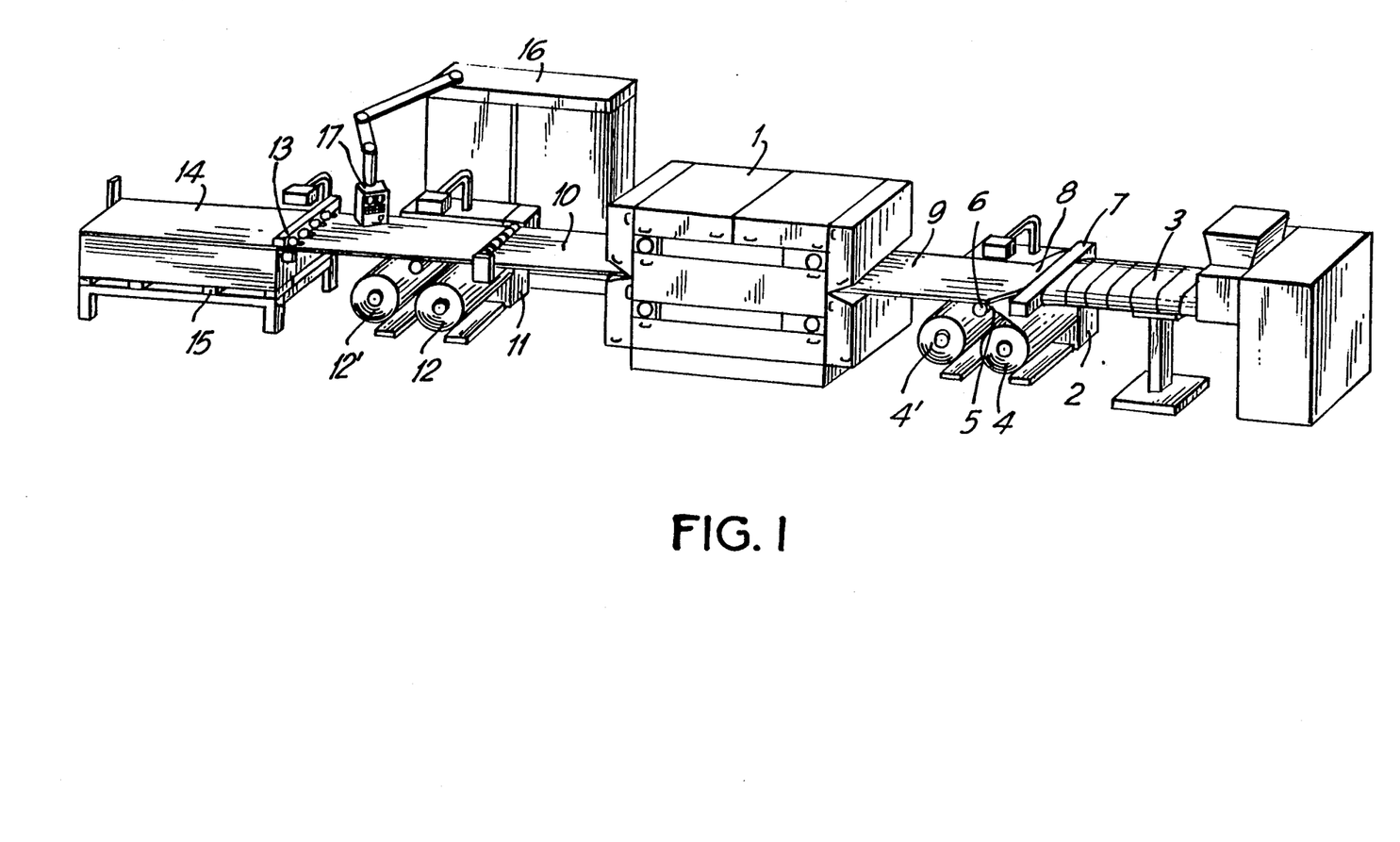
FIG. 1 is a perspective view of a process and apparatus for the continuous fabrication of resin impregnated material webs.

Referring now to the drawings, wherein like numerals reflect like elements throughout the various views, FIG. 1 depicts schematically an apparatus for the continuous fabrication of prepregs from woven fiber glass webs impregnated with epoxy resin and pre-cured to the B-state. These prepregs form the insulating core layer between the two copper foils in the production of copper-lined laminates. In subsequent pressing of the prepregs with the copper foils in a continuously operating double band press or discontinuously operating platen press, the epoxy resin cures completely to the C-state and connects the individual layers with one another to form the compact laminate. The copper-lined laminate now serves, in turn, as starting material for the production of printed circuit boards.

The apparatus generally comprises a double band press 1 and a wind-off unit 2 and extruder 3 situated before the inlet of the press 1. A supply roll 4 and auxiliary roll 4' with woven fiber glass which has not been impregnated with resin are located in the wind-off unit 2. An extruder 3 for producing an epoxy resin melt is arranged in the vicinity of the wind-off unit 2. A wind-on unit 11 with a roll 12 and auxiliary roll 12' for the prepreg web 10 are located subsequent to the double band press 1. Alternatively, the prepreg web 10 can also be divided in a cross-cutting unit 13 into sheet-shaped portions 14 of desired dimensions which are stacked in pallets 15 for further transport. Such a procedure can be offered when the prepreg is further processed subsequently in a discontinuously operating platen press to form copper laminates in portions. The entire apparatus is controlled by a computer in a control box 16. Data is input by the user via the terminal 17. In particular, the temperatures in the extruder 3 and in the double band press 1 and the feed rate of the prepreg web 10 are adjusted by the user at the terminal 17 and controlled by the computer.

The woven fiber glass web 5, which is not impregnated with resin, is continuously drawn off from the supply roll 4 in the wind-off unit 2 and fed to the double band press 1 via a deflecting roller 6 corresponding to the process according to the invention. Another supply roll 4', from which the woven fiber glass web 5 is wound off as soon as the woven fiber glass web 5 from the supply roll 4 comes to an end, is located in the wind-off unit 2. This ensures an uninterrupted operation of the entire apparatus. The epoxy resin is melted in the extruder 3 and the melt is applied to the woven fiber glass web 5 as film 8 in the vicinity of the deflecting roller 6 via a wide-slot die 7 of the extruder 3. This layer formation 9, comprising the woven fiber glass web 5 and epoxy resin film 8, is then introduced into the double band press 1 and heated in the latter while acted upon by area pressure. In so doing, the epoxy resin melt penetrates into the woven fiber glass web and continues to cure until the B-state is reached. In order to raise the quality further, the layer formation can then be cooled in the double band press 1, accompanied by the continued application of area pressure. Cooling can also be necessary in that the pre-cured epoxy resin melt in the B-state at the end of the heated reaction zone is still viscous-sticky at the temperature prevailing in the reaction zone. The prepreg must then be cooled below the softening temperature of $<60°$ C. in a cooled reaction zone directly adjoining the heated reaction zone so that it can be detached from the press band surfaces without leaving a residue. The woven fiber glass web 5 which is pre-cured to the B-state and impregnated with epoxy resin, i.e. the so-called prepreg web 10, leaves the double band press 1 at the outlet of the double band press 1 in the cooled non-sticky state and is continuously wound onto the roll 12 of the wind-on unit 11. If the roll 12 is full the prepreg web 10 can be wound on an auxiliary roll 12' without interrupting production. Alternatively, as explained, the prepreg web 10 can also be divided into sheet-shaped portions 14.

Due to the electrostatic attraction, dust particles can collect on the prepreg web 10 subsequent to the double band press 1 which can lead to defective places in the laminate in subsequent pressing. For this reason it may be necessary to arrange tip ionizers for reducing the static electric charge on the prepreg web 10 subsequent to the double band press 1.

The epoxy resin used for extrusion is a mixture of flakes or powder of solid resin which contains no solvent or at most a small proportion of solvent. As a rule, it comprises a plurality of components such as a mixture of low-molecular epoxy resin cured to the A-state, brominated epoxy resin, hardener, accelerator and possibly additional ingredients. These individual components are mixed together in the desired gravimetric ratio. For high-quality copper-lined laminates the components are selected to form an epoxy resin system of FR4 quality, i.e. nonflammable and corresponding to U.S. Standard NEMA-LI1.

Figure 2:
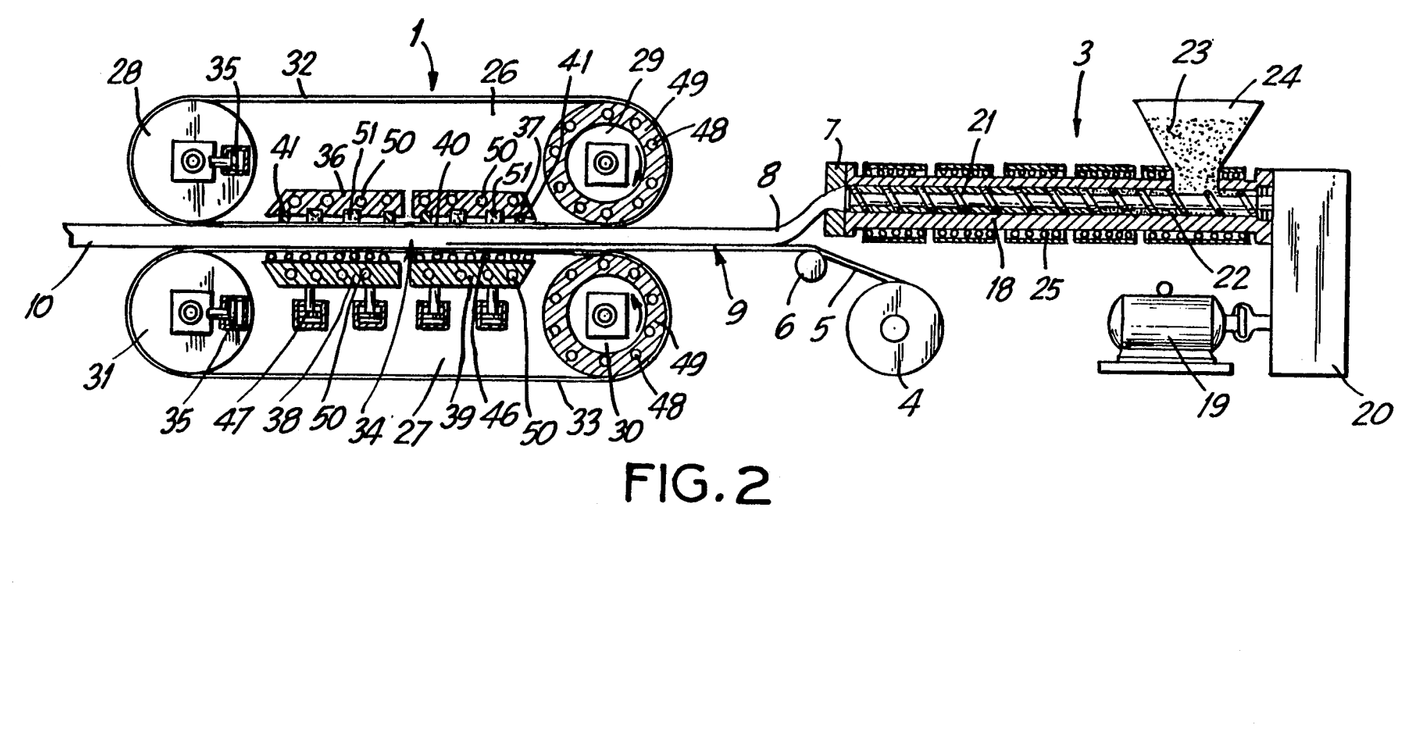
FIG. 2 is a cross-sectional view through a double band press with an extruder arranged upstream.

FIG. 2 is a schematic sectional view of the extruder 3 used for producing the epoxy resin melt with a double band press 1 arranged downstream. The extruder 3 comprises an elongated cylinder 18 having therein a worm 21 driven by a motor 19 via a step-down gear unit 20. The worm 21 receives the mixture of flakes or powder of epoxy resin 23 to be melted in its rear portion in its spiral-shaped depressions 22. The epoxy resin 23 is poured into a funnel 24 of the extruder 3. The epoxy resin 23 is transported further with the worm 21 and melted during this transportation. For this purpose, a plurality of heating sleeves 25 are placed around the cylinder 18. The epoxy resin 23 is heated, melted and condensed as it is conveyed through the cylinder 18 so that it forms a homogeneous, viscous-elastic melt at the front end of the worm 21. The epoxy resin melt passes through the wide-slot die 7 flanged on at the front part of the cylinder 18 as a flat film 8 having a substantially rectangular cross section. As a rule, this film 8 has a processing temperature of 100° to 150° C., preferably 130° C.

The extruder 3 has a lip regulated wide-slot die 7 to ensure a uniform impregnation of the woven fiber glass web 5 with a constant area weight.

In such a lip regulated wide-slot die 7, the profile or section of the die is adjustable so as to enable a homogenization of the film 8 of epoxy resin melt exiting from the wide-slot die 7. The section adjustment of the wide-slot die 7 is effected in turn as a function of the area weight of the resin in the woven fiber glass of the prepreg web 10. This area weight is determined by a measuring system comprising the beta emitter arranged prior to the double band press 1 at the woven fiber glass web 5, and a beta emitter arranged subsequent to the double band press 1 at the prepreg web 10. The two beta emitters are movable transversely along the width of the woven fiber glass web 5 or prepreg web 10. The intensity of the backscattered radiation or irradiation of the beta emitters is calculated by a detector and the area weight of the resin in the prepreg is calculated from this according to known laws. Based on the determined area weight, the mass throughput of the extruder with respect to melted resin can be further regulated by adjusting the speed of the worm 10 and the heating sleeves 25.

The continuously operating double band press 1, into which the layer formation 9 of epoxy resin melt film 8 and woven fiber glass web 5 enters, is likewise shown in FIG. 2 in more detail and in section. It comprises an upper press band unit 26 and lower press band unit 27. The press band units 26, 27 are composed of two deflecting rollers 28, 29 and 30, 31, respectively, and an endless press band 32, 33 which is guided around the deflecting rollers 28, 29 and 30, 31. The four deflecting rollers 28, 29, 30, 31 are rotatably supported in a press frame which is not shown in the drawing for the sake of simplicity, and the two press bands 32, 33 move corresponding to the arrows in the deflecting rollers 29, 30. The press bands 32, 33, which conventionally comprise a high-tensile steel belt, are tensioned by known means, e.g. hydraulic cylinders 35.

The reaction zone 34 in which the layer formation 9 running from right to left with respect to the drawing is processed while acted upon by area pressure is located between the lower portion of the upper press band 32 and the upper portion of the lower press band 33. The area pressure exerted in the reaction zone 34 of the double band press 1 is applied hydraulically via pressure plates 36, 37 or mechanically via pressure plates 38, 39 to the inner sides of the press bands 32, 33 and is then transmitted from the latter to the layer formation 9 to be pressed. The reaction forces exercised by the layer formation 9 are in turn transmitted into the press frame via the pressure plates 36, 37, 38, 39, In the hydraulic transmission of pressure, a fluid pressure medium which can be put under pressure is introduced into a pressure chamber 40, as shown in FIG. 2 with reference to the upper press band unit 26. The pressure chamber 40 is defined by the pressure plate 36, 37, the inner side of the press band 32, and laterally by an annularly self-enclosed floating seal 41 arranged in the pressure plate 36, 37. The construction of the floating seal 41 which is rectangularly self-enclosed along the edge of the pressure plate 36, 37 can be seen in more detail in FIG. 4.

Figure 4:
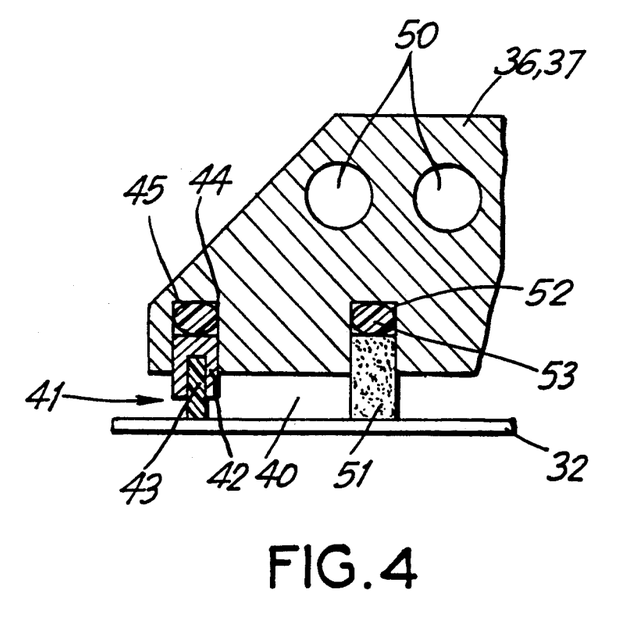
FIG. 4 is a cross-sectional view of the pressure plate along line A—A of FIG. 3.

The floating seal comprises a U-shaped holding strip 42 of metal in which the elastic sealing body 43 is clamped. The U-shaped holding strip 42 is located in a groove 44 along the edge of the pressure plate 36, 37. An O-ring 45 lies on the holding strip 42 so as to face the groove base. A pressure medium acts on the O-ring 45 proceeding from the groove base so that the sealing body 43 is pressed against the inner side of the press band 32 and the pressure chamber 40 is sealed toward the sides. A synthetic oil is preferably used as pressure medium for the pressure chamber 40. But a gas, e.g. compressed air, can also be used just as easily.

Stationary rolls 46 are arranged between the pressure plate 38, 39 and the inner side of the press band 33 for mechanically generating the area pressure, as is shown in FIG. 2 at the lower press band unit 27. The pressure plate 38, 39, including the rolls 46, is placed against the inner side of the press band 33 by hydraulic cylinders 47. The pressure plates 36, 37 can also be provided with a mechanical pressure transmission system and the pressure plates 38, 39 can be provided with a hydraulic pressure transmission system. If desired, the transmission of pressure can also be effected by combined hydraulic/mechanical means by simultaneously applying the two principles described above. The combined hydraulic/mechanical transmission of pressure is discussed in more detail in DE-OS 33 04 754.

During the application of area pressure on the layer formation 9 in the reaction zone 34 of the double band press 1, the layer formation 9 is first heated. The deflecting rollers 29, 30 on the inlet side are constructed to be heatable for transmitting the necessary heat. For this purpose, ducts 48 are situated in the outer casing 49 of the cylindrical deflecting rollers 29, 30 on the inlet side. A heat carrier medium, e.g. thermal oil, which transmits heat to the deflecting rollers 29, 30 by convection, circulates through the ducts 48. The heat of the deflecting rollers 29, 30 is transmitted from the latter to the press bands 32, 33 and finally is transmitted from the latter in the reaction zone 34 to the layer formation 9. Instead of heating by a heat carrier medium circulating in the ducts 48, electrically operated heating cartridges can also be arranged in the outer casing 40 of the deflecting rollers 29, 30 on the inlet side.

For further heating of the layer formation 9 in the reaction zone 34, the pressure plates 37, 39 arranged on the inlet side can be constructed as heating plates. To this end, ducts 50 through which a heat carrier medium flows, are located in the pressure plates 37, 39. The heat carrier medium transmits heat to the pressure plates 37, 39 when flowing through the ducts 50 by means of convective transmission of heat. The pressure plates 37, 39 are heated to a temperature which is higher than the temperature of the press bands 32, 33 in the reaction zone 34. The heating of the pressure plates 37, 39 can also be effected by electrical heating elements.

In the mechanical transmission of pressure, heat is transmitted from the pressure plate 39 to the press band 33 due to the drop in temperature via the rolls 46 which comprise metal with good thermal conductivity. In hydraulic transmission of pressure, heat conducting elements 51 are arranged in the pressure plate 37. These heat conducting elements 51 comprise a material with good thermal conductivity, have good heat conducting contact with the pressure plate 37 with one surface, and contact the inner side of the press band 32 with another surface so that the inner side of the press band 32 slides along this surface of the heat-conducting element 51. Due to the drop in temperature between the pressure plate 37 and the press band 32, heat is accordingly transmitted from the pressure plate 37 to the press band 32 via the heat conducting element 51. If the flow of heat via the rolls 46 is not sufficiently great, additional heat conducting elements 51 of this kind can also be arranged between the rolls 46. Finally, the heat is transmitted from the press band 32 to the layer formation 9.

Figure 3:
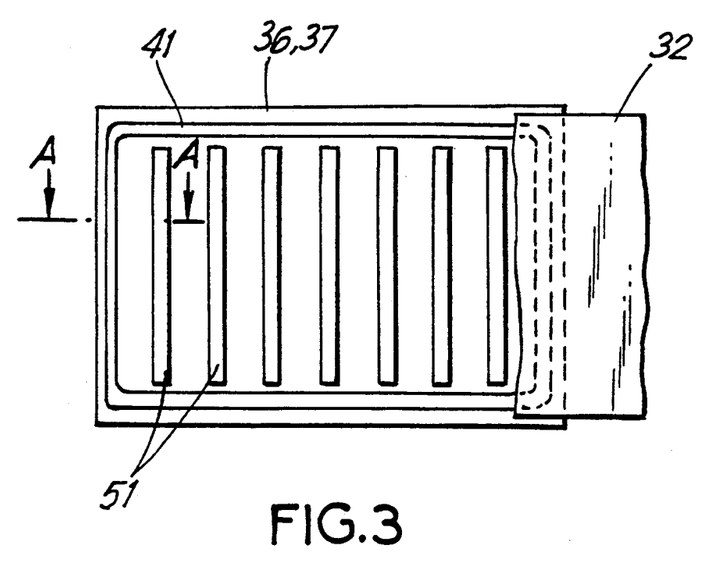
FIG. 3 is a top view of the pressure plate of the double band press.

Heat conducting elements of a rod-shaped construction which extend transversely along the pressure plate 36, 37 can be seen in more detail in FIGS. 3 and 4. Grooves 52 arranged transversely relative to the forward feed direction of the press band 32 are located in the pressure plate 36, 37. Rod-shaped heat conducting elements 51 are inserted in these grooves 52 in such a way that they contact the wall of the groove 52 while forming a good heat conducting contact. An elastomer seal 53 lies on the heat conducting element 51 to face the groove base and is acted upon by a pressure medium proceeding from the groove base so that the heat conducting element 51 always maintains contact with the press band 32. The heat conducting element 51 comprises copper. The specific construction of the heat conducting elements and further embodiment forms are known per se from DE-OS 33 25 578 or DE-OS 39 21 364 and therefore need not be discussed at greater length.

If desired, a zone in which the layer formation 9 is cooled accompanied by the action of area pressure can follow the heating in the double band press. For this purpose, the pressure plates 36, 38 are constructed as cooling plates in that a cooled heat carrier medium is guided through the ducts 50 so that the pressure plates 36, 38 are kept at a temperature which is very much lower than the final temperature to be reached by the prepreg web 10. Heat flows from the press band 32, 33 to the pressure plate 36, 38 via heat conducting elements 51 or the rolls 46. The coolant absorbs the heat from the pressure plate 36, 38 and carries it away so that the reference temperature of the pressure plate 36, 38 is held at the desired low level. Of course, the cooling of the pressure plate 36, 38 can also be effected electrically, e.g. by means of Peltier elements.

The layer formation 9 which comprises the woven fiber glass web 5 at room temperature and the film 8 of epoxy resin which is heated to approximately 120° C. to 130° C. is first heated further in the reaction zone 34 of the double band press 1 between the pressure plates 37 and 39. The heating is continued until reaching a temperature between 220° C. and 350° C., preferably 300° C. The viscosity of the epoxy resin melt continues to decrease as a result of the action of heat and the epoxy resin penetrates to a greater degree in the hollow spaces of the woven fiber glass web 5 because of the action of the area pressure and completely wets the glass fibers. The epoxy resin continues to cure simultaneously. The layer formation 9 then passes through the cooled reaction zone 34 between the two pressure plates 36 and 38.

In so doing, the layer formation is cooled. The cooling is effected to 40° C. to 80° C. preferably 60° C., so that the prepreg web 10 leaves the double band press 1 in a non-sticky state. Should difficulties nevertheless arise in separating the prepreg web 10 from the press bands 32, 33, the press bands 32, 33 can be provided with a separation layer, e.g. of a material sold under the trademark, or a separating foil can be guided through the double band press 1 together with the layer formation 9. The rate at which the layer formation 9 passes through the double band press 1 is selected in such a way that the prepreg web 10 is completely impregnated with epoxy resin when leaving the double band press 1 and is pre-cured to the B-state. Under certain conditions a cooling of the prepreg web 10 in the double band press 1 can even be dispensed with, i.e. the layer formation 9 is heated only under the influence of the area pressure in the double band press 1.

It has been shown that the invention facilitates production prepregs of a much better quality than can be produced with the conventional process. No air or gas inclusions which detract from the technical characteristics of the laminate produced from it, e.g. dielectric constant, strength, etc., are to be seen in the prepreg leaving the double band press 1. On the contrary, the prepreg is completely clear. It is assumed that much better resorption of enclosed gases and air in the resin takes place under the application of the area pressure so that no air or gas bubbles are formed. The solvent-free solid resin which was hardly used previously can be used in the process according to the invention so that no solvents are required for reasons relating to process technology and no solvent vapors which lead to considerable environmental loading in the conventional process occur at all. Since very high temperatures up to at least 300° C. can be applied in the heating zone of the double band press with no evident damage to the resin, the process can proceed at very high feed rates and accordingly in an extremely economical manner.

In the described apparatus according to the invention, it is possible to adjust a temperature profile which is optimally adapted to the type of resin used in the reaction zone 34 of the double band press 1. For this purpose, the pressure plates 37, 39 and 36, 38 are divided into individual pressure plates and each of these individual pressure plates is kept at a determined temperature of the temperature profile. It is accordingly possible to adjust the viscosity of the resin a directed manner which leads to a particularly good wetting of the woven fiber glass web.

Figure 5:
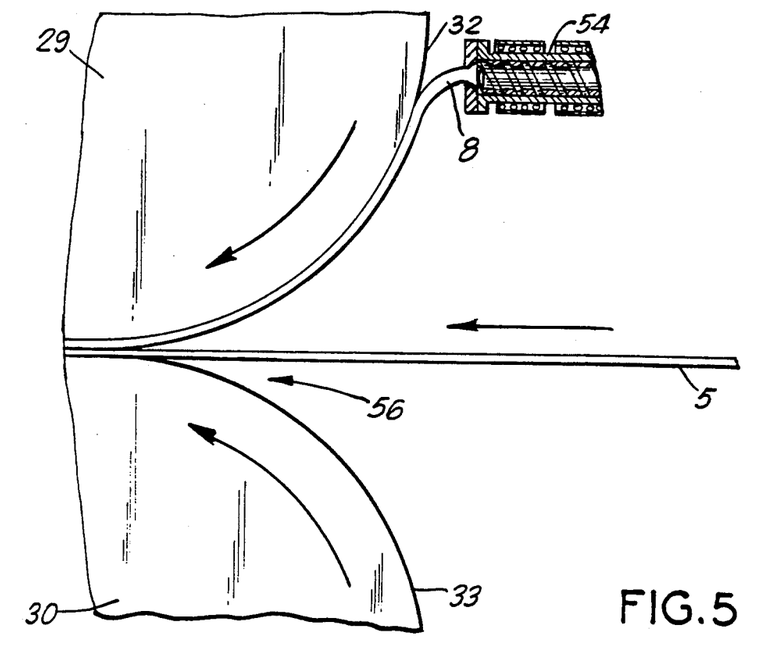
FIG. 5 is an inlet zone of a double band press in another embodiment for the process for fabricating resin impregnated material webs.

FIG. 5 shows the inlet area of a double band press according to another embodiment of the invention. In this case, the extruder 54 is arranged in the vicinity of the upper deflecting roller 29 on the inlet side. The film 8 comprising epoxy resin melt is applied to the press band 32 contacting the deflecting roller 29, and is guided with the press band 32 to the inlet of the double band press. The woven fiber glass web 5 is likewise introduced between the two press bands 32, 33 at the inlet into the double band press and comes in contact with the film 8 in the inlet zone 56, so that the impregnation of the woven fiber glass web 5 with the epoxy resin to form the prepreg can be carried out in the reaction zone 34 of the double band press as already described.

Figure 6:
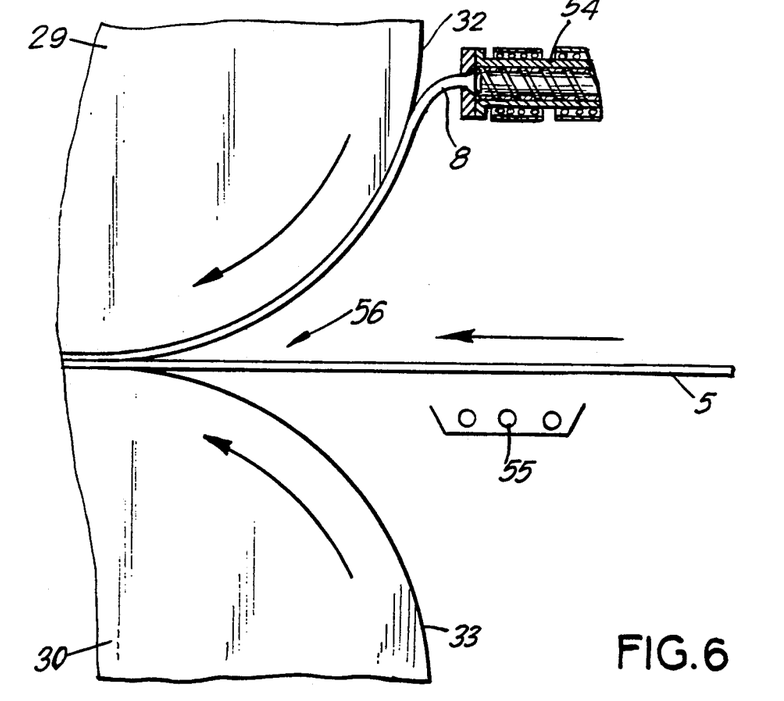
FIG. 6 shows an inlet zone of a double band press in another embodiment.
Figure 7:
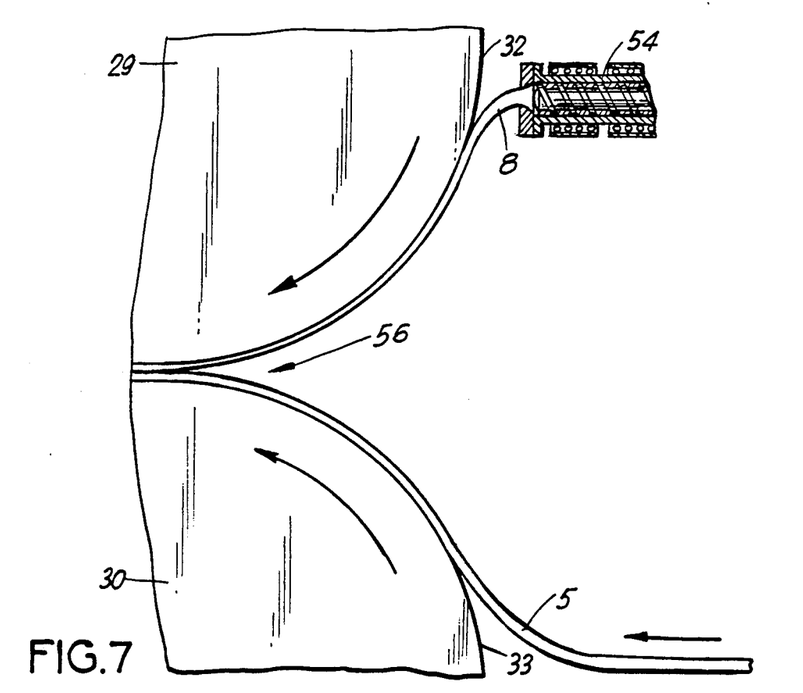
FIG. 7 shows an inlet zone of a double band press in yet another embodiment form.

The woven fiber glass web 5 is inserted into the double band press 1 at room temperature according to the preceding embodiment. To further increase the feed rate of the layer formation through the double band press 1, the woven fiber glass web 5 can also be preheated before being introduced into the double band press 1, preferably to a temperature between 60° C. and 120° C. As can be seen in FIG. 6, infrared radiators 55 which act on the woven fiber glass web 5 are situated at the inlet into the double band press 1 in order to effect a pre-heating of the woven fiber glass web 5. In another embodiment (see FIG. 7), the woven fiber glass web 5 is guided at the inlet into the double band press 1 in such a way that it is guided along a portion of the circumference of the heated deflecting roller 30 to contact the press band 33. The woven fiber glass web 5 is accordingly pre-heated to the desire temperature.

Figure 8:
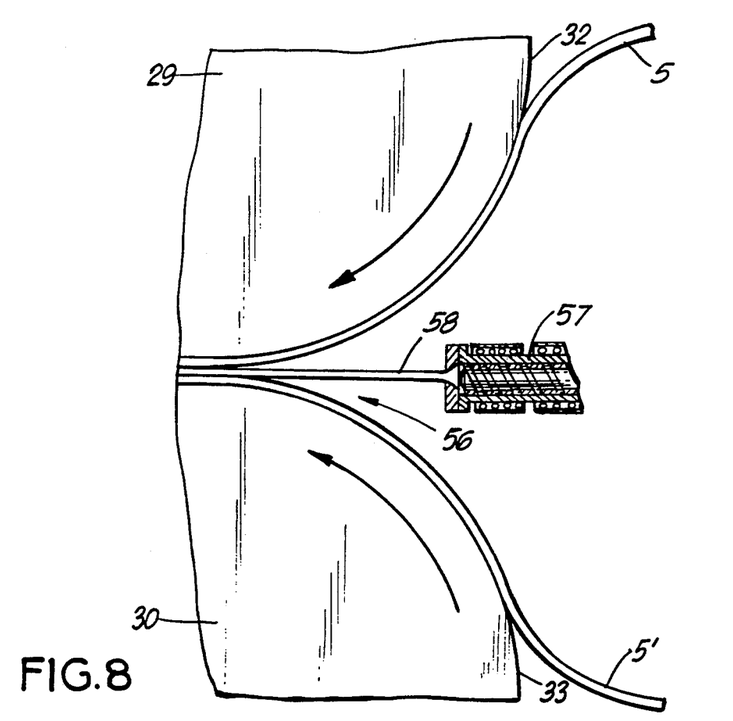
FIG. 8 shows the inlet zone of a double band press in still another embodiment form.

In another embodiment, (see FIG. 8) a doubled prepreg web can also be produced. A woven fiber glass web 5 and 5' is introduced into the inlet zone 56 of the double band press via the press band 32 and 33 along the deflecting roller 29 and 30. An epoxy resin film 58 is extruded by an extruder 57 between the two woven fiber glass webs 5, 5' so that the two woven fiber glass webs 5, 5' are impregnated with resin simultaneously in the reaction zone 34 of the double band press 1.

If a pre-impregnation of the woven fiber glass web with the epoxy resin without the use of pressure is desired, the extruder can also be arranged between the deflecting roller 28 and 31 on the outlet side and the deflecting roller 29 and 30 on the inlet side, respectively, in the vicinity of the upper returning portion of the press band 32 or in the vicinity of the lower returning portion of the press band 33 respectively (see FIG. 2). The epoxy resin melt is then extruded as a film on the returning portion of the press band 32 and 33, and the woven fiber glass web 5 is placed on this returning band portion. If desired, additional heat can be supplied to this returning portion of the band with known means. The resin melt then penetrates to a certain degree, without pressure, into the woven fiber glass web 5 which is transported to the inlet zone of the double band press by the returning band portion of the press band 32, 33, so that a certain pre-impregnation of the woven fiber glass web 5 has taken place before reaching the inlet zone. From the inlet zone the woven fiber glass web 5 with the resin melt is inserted further into the reaction zone 34, where the final impregnation is carried out, as is described further above, with pre-curing of the resin until the B-state is reached.

It is also possible to arrange a plurality of extruders 3 or a plurality of wide-slot dies supplied by an extruder prior to the double band press 1 which apply a film 8 of resin on a material web 5 wound off from the supply rolls 4, and to introduce these material webs 5 provided with resin into the double band press 1, together possibly with an intermediate separating foil, and to carry out the impregnating process with the application of area pressure and heat as described above. The individual resin impregnated material webs 10 are then separated from one another at the outlet of the double band press, wound on a roll 12 and stored for further processing.

The apparatus for implementing the process according to the invention can also be additionally modified in that a conventional spreading device with which the solid resin powder and solid resin flakes are spread on the material web 5 is arranged in place of the extruder 3. The material web 5 with the spread on solid resin is then introduced into the double band press 1 and heated under area pressure. In so doing, the solid resin melts and penetrates into the material web 5, wherein the latter is impregnated by resin as was described further above.

An embodiment example of a prepreg web produced with the process and apparatus according to the invention is now described. A woven fiber glass web of the U.S. Style 7628 type was provided with a film of epoxy resin melt produced by an extruder. The film leaving the extruder had a thickness of 0.2 mm and a temperature of 130° C. The epoxy resin comprised a brominated epoxy resin of the FR4 type with dicyandiamide hardener and an imidazole accelerator. The deflecting rollers of the double band press on the input side were heated to a temperature of 80° C. The heated reaction zone had a length of 1500 mm and was heated to a temperature of 220° C. the subsequent cooled reaction zone with a length of 500 mm was cooled to 40° C. An area pressure of 15 bar was exerted in the reaction zone. At a feed rate of 20 m/min, a prepreg of outstanding quality was obtained which was completely free of bubbles with a pre-curing degree of 50% ( B-state ).

The process according to the invention has been discussed with reference to the production of prepreg webs comprising woven fiber glass webs impregnated with epoxy resin, since particularly high demands are made on such prepregs in practice with respect to quality. However, it is suitable for the production of any desired resin impregnated material webs. For example, melamine resin, urea resin, etc, as well as paper webs, fiber glass mats and the like can be used. Accordingly, melamine resin impregnated paper webs which are used for the production of decorative laminates can also be produced. Finally, the process according to the invention can also be applied favorably in the impregnation of material webs with thermoplastic resins. Under certain conditions, the heating in the double band press can even be dispensed with and cooling need only be effected under the influence of area pressure on the material web.

While the preferred embodiment of the invention has been described in detail, various modifications and adaptations may be made thereto without departing from the spirit and scope of the invention as delineated in the following claims:

What is claimed is:

1. A process for the continuous fabrication of resin impregnated material webs, comprising the steps of:
    winding off a substantially resin-free material web from a first roll means;

providing a low-solvent or solvent-free solid resin in the form of flakes or powder, wherein said resin is heat treatable and can be cured by heat, chemical reactions or cooling;

extruding a film from the resin;

joining the extruded film with the substantially resin-free material web to form a layer formation; and subjecting the layer formation to heat and area pressure.

2. A process for the continuous fabrication of resin impregnated material webs, comprising the steps of:

winding off a substantially resin free material web from a first roll means;

providing a low-solvent or solvent-free solid resin in the form of flakes or powder, wherein said resin is heat-treatable and can be cured by heat, chemical reactions or cooling;

spreading the resin on the substantially resin-free material web; and subjecting the resin-covered material web to heat and area pressure.

3. The process of claim 1, further comprising the step of cooling the material web provided with the resin under the influence of the area pressure.

4. The process of claim 2, further comprising the step of cooling of the material web provided with the resin under the influence of the area pressure.

5. The process of claim 1, wherein the temperature of the extruded film lies between 100° and 150° C.

6. The process of claim 1, wherein the material web provided with resin is heated to a temperature between 200° C. and 300° C.

7. The process of claim 3 wherein the cooling of the material web provided with resin is effected between 20° C. and 80° C.

8. The process of claim 4, wherein the cooling of the material web provided with resin is effected between 20° C. and 80° C.

9. The process of claim 7, wherein the material web is pre-heated before it is provided with resin.

10. The process of claim 8, wherein the material web is pre-heated before it is provided with resin.

11. The process of claim 9, wherein material web is preheated to a temperature between 60° C. and 120° C.

12. The process of claim 10, wherein material web is preheated to a temperature between 60° C. and 120° C.

13. The process of claim 1, wherein the heating of the material web provided with resin is effected corresponding to a temperature profile adapted to the resin.

14. The process of claim 2, wherein the heating of the material web provided with resin is effected corresponding to a temperature profile adapted to the resin.

15. The process of claim 3, wherein the heating of the material web provided with resin is effected corresponding to a temperature profile adapted to the resin.

16. The process of claim 4, wherein the heating of the material web provided with resin is effected corresponding to a temperature profile adapted to the resin.

17. The process of claim 5, wherein the heating of the material web provided with resin is effected corresponding to a temperature profile adapted to the resin.

18. The process of claim 7, wherein the area pressure is exerted on the material web provided with resin between two press bands of a continuously operating double band press, wherein said press bands are guided over two deflecting rollers.

19. The process of claim 1, wherein the material web is placed on a press band of the double band press and the resin is subsequently applied to this material web as film.

20. The process of claim 1, wherein the resin is applied as a film to a press band of the double band press and the material web is subsequently placed on the film.

21. The process of claim 18, wherein the resin is introduced as film between two material webs and the formation comprising film and material webs is subsequently introduced between the two press bands of a double band press.

22. The process of claim 1, wherein the feed of resin during the extrusion is regulated as a function of the area weight of the proportion of resin located in the resin impregnated material web.

23. The process of claim 2, wherein the feed of resin during the spreading is regulated as a function of the area weight of the proportion of resin located in the resin impregnated material web.

24. The process of claim 22, wherein the area weight of the resin proportion in the resin impregnated material web is determined by intensity of beta rays backscattered on the material web or passing through the material web.

25. The process of claim 1, wherein said resin is a duroplastic resin and is pre-cured to the B-state in the resin impregnated material web.

26. The process of claim 2, wherein said resin is a duroplastic resin and is pre-cured to the B-state in the resin impregnated material web.

27. The process of claim 25, wherein a prepeg is produced and wherein a woven glass fiber web is used as material web and an epoxy resin is used as resin.

28. The process of 26, wherein a prepeg is produced and wherein a woven glass fiber web is used as material web and an epoxy resin is used as resin.

* * * * *